United States Patent [19]
Liu et al.

[11] Patent Number: 5,518,956
[45] Date of Patent: May 21, 1996

[54] METHOD OF ISOLATING VERTICAL SHORTS IN AN ELECTRONIC ARRAY USING LASER ABLATION

[75] Inventors: Yung S. Liu, Schenectady; Renato Guida, Wynantskill; Ching-Yeu Wei, Schenectady, all of N.Y.

[73] Assignee: General Electric Company, Schenectady, N.Y.

[21] Appl. No.: 115,082

[22] Filed: Sep. 2, 1993

[51] Int. Cl.⁶ ................................................. H01L 21/26
[52] U.S. Cl. .................... 437/173; 437/922; 437/923; 219/121.69; 359/36
[58] Field of Search .................. 437/922, 923, 437/173; 219/121.66, 121.67, 121.68, 121.69

[56] References Cited

U.S. PATENT DOCUMENTS

| | | | |
|---|---|---|---|
| 4,044,222 | 8/1977 | Kestenbaum | 437/173 |
| 4,240,094 | 12/1980 | Mader | 357/45 |
| 4,259,367 | 3/1981 | Dougherty, Jr. | 427/96 |
| 4,358,659 | 11/1982 | Spohnheimer | 219/121 LB |
| 4,688,896 | 8/1987 | Castleberry | 350/333 |
| 4,720,620 | 1/1988 | Arima | 437/173 |
| 4,774,193 | 9/1988 | Juergens | 437/923 |
| 4,840,459 | 6/1989 | Strong | 350/333 |
| 4,894,115 | 1/1990 | Eichelberger et al. | 219/121.69 |
| 4,937,423 | 6/1990 | Yoshihara et al. | 219/121.72 |
| 5,002,367 | 3/1991 | Nicholas | 350/333 |
| 5,024,968 | 6/1991 | Engelsberg | 437/173 |
| 5,062,690 | 11/1991 | Whetten | 359/59 |
| 5,124,816 | 6/1992 | Yoshihara et al. | 359/36 |
| 5,173,441 | 12/1992 | Yu et al. | 473/173 |
| 5,211,805 | 5/1993 | Srinivasan | 156/643 |
| 5,332,879 | 7/1994 | Radhakrishnan et al. | 219/121.69 |

FOREIGN PATENT DOCUMENTS

| | | | |
|---|---|---|---|
| 0272799 | 6/1988 | European Pat. Off. | 437/928 |
| 0194741 | 8/1986 | Japan | 437/922 |

OTHER PUBLICATIONS

Raffel et al., "Laser Programmed Vias For Restructurable VLSI", International Electron Devices Meeting, IEEE, Dec. 1980, pp. 132–135.

Gullette et al., "Laser Personalization of MOS Digital Topologies", 1983 IEEE Symposium on Circuits & Systems, Newport Beach, CA, 2–4 May 1983, vol. 3, pp. 1249–1252.

Y. S. Liu et al., Laser Ablation of Polymers for High–Density Interconnect, Elsevier Science Publishers B.V., 1993, pp. 15–29.

Vu Tran, Application of a Xenon Laser In Microelectronics and Liquid Crystal Displays, Florod Corp., Gardena, Calif.

Primary Examiner—Brian E. Hearn
Assistant Examiner—Lynne A. Gurley
Attorney, Agent, or Firm—Donald S. Ingraham; Marvin Snyder

[57] ABSTRACT

A process for repairing an electronic army wafer assembly having a short circuit between two non-insulative layers separated by a dielectric layer includes the step of selectively ablating one of the non-insulative layers so as to electrically isolate the situs of the short circuit while maintaining the electrical integrity of the underlying non-insulative layer intact. A laser beam is directed onto the non-insulative layer and scanned in a selected pattern to isolate the situs of the short circuit; the laser is further controlled such that a selected energy density is delivered to the surface to be ablated such that the underlying non-insulative layer is not damaged.

8 Claims, 1 Drawing Sheet

5,518,956

METHOD OF ISOLATING VERTICAL SHORTS IN AN ELECTRONIC ARRAY USING LASER ABLATION

BACKGROUND OF THE INVENTION

Complex electronic devices are commonly formed on substrates through the deposition and patterning of multiple layers of conductive, semiconductive, and dielectric materials so as to form multiple individual electronic components. For example, large area imager arrays (e.g., having an area of about 200 square centimeters or more) are commonly fabricated on a wafer and contain photodiodes and circuitry for reading the output of the photodiodes, such as address lines and switching components (e.g., thin film transistors). Defects in such imager arrays can result from, among other causes, impurities in materials deposited to form the various components. One example of such an impurity-based defect is an unwanted conductive path, or short circuit, between two conductive layers separated by a dielectric layer. Such defects can disrupt the desired electrical connections between devices in the array and thus seriously degrade the performance of one or more of the individual electronic components on the wafer, often to the point of making an entire wafer unusable. It is thus advantageous to be able to repair defects in a wafer, either during the fabrication process, or after completion of the wafer.

Repair schemes for wafers often involve having different making connections to backup address lines incorporated into the wafer, such as is disclosed in U.S. Pat. No. 4,688,896 of Castleberry, U.S. Pat. No. 4,840,459 of Strong, and U.S. Pat. No. 5,062,690 of Whetten, all of which are assigned to the assignee of the present invention. This type of approach is primarily useful in repairing shorts between components, such as address lines, that are substantially disposed horizontally with respect to the other in the array; this approach is less feasible to use when the defect is a short circuit between a large conductive layer, such as the transparent common electrode disposed over the photosensor array, and an underlying component, such as an address line or photodiode pixel, separated by a substantially transparent dielectric material. In particular, such a "vertical" defect (i.e., short circuit or conductive path between the two layers, disposed one over the other and separated by a dielectric layer) can occur almost anywhere in the large area covered by the common electrode. Further, lasers of the type used in address line repair necessarily are powerful enough to penetrate deep into the array and thus typically are too powerful to use to ablate only a portion of the common electrode, which commonly comprises a transparent conducting oxide (TCO), layer, without damaging the underlying electronic component. Laser techniques for repair of individual address lines further require precise alignment so as to sever only the correct portion of one address line disposed closely to other components and address lines.

It is thus an object of this invention to provide a method of repairing an electronic-array structure having an undesired conductive path between two layers of electronic components in the array such that the situs of the conductive path can be isolated in one layer of the electronic components without causing damage to the other electronic component layer.

It is a further object of this invention to provide a method to selectively ablate a portion of the a conductive layer without completely removing a dielectric layer disposed thereunder.

It is still a further object of this array to provide a facile method of repairing a photosensor array having a TCO layer disposed thereover by electrically isolating the portion of the TCO layer at which the vertical short exists without breaking the electrical integrity of underlying components of the imager array.

SUMMARY OF THE INVENTION

A method of repairing an electronic wafer assembly having a defect in a dielectric layer disposed between a first and a second non-insulative layer of electronic components in the array such that an undesired conductive path exists therebetween, includes the step of selectively ablating a portion of one of the non-insulative electronic component layers to electrically isolate the situs of the undesired conductive path without breaking the electrical integrity of the other of the non-insulative electronic component layers. The selective ablation step includes the steps of controlling a laser to apply a selected energy density to the portion of the non-insulative electronic component layer to be ablated by selecting an ablating light frequency, a laser ablating pulse rate, a laser ablating pulse width, and directing the laser beam through focussing optics.

The method of the present invention is particularly adapted to repairing an imager array having a short circuit resulting from a vertical defect in the dielectric material disposed between the upper transparent conductive common electrode layer of a photosensor array and an underlying electrically conductive layer. A laser beam is directed onto the common electrode at the situs of the vertical defect to ablate that portion of the common electrode and electrically isolate the portion of the common electrode layer around the situs of the short circuit. The laser beam is controlled such that the electrical integrity of the imbedded electrically conductive component underlying the situs of the short circuit is not broken. The step of directing the laser beam onto a portion of the common electrode includes scanning the beam in a selected pattern, such as a spot scan, a line scan, or a circular scan.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 1 (B) is a plan view of a portion of an electronic array wafer having a vertical defect in a dielectric layer resulting in an undesired conductive path between two non-insulative layers in the array.

DETAILED DESCRIPTION OF THE INVENTION

Figure 1A:
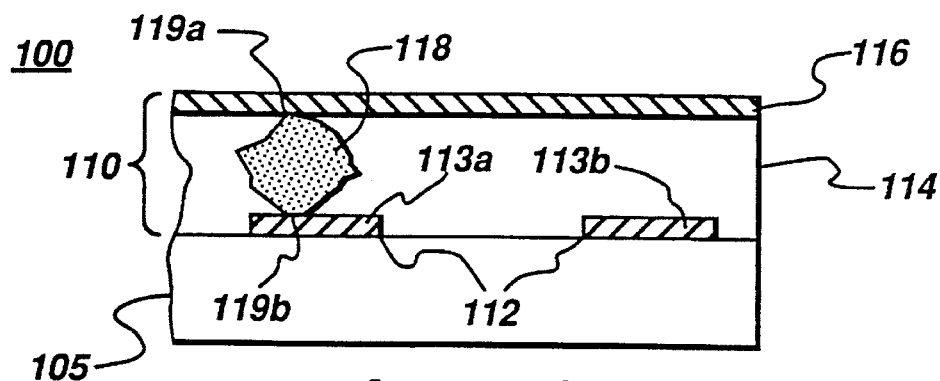
FIG. 1 (A) is a cross-sectional view of a portion of an electronic array wafer having a vertical defect in a dielectric layer resulting in an undesired conductive path between two non-insulative layers in the array.

An electronic array wafer assembly 100, such as an imager army, typically comprises a substrate 105 with the components comprising the electronic array disposed thereon, as illustrated in FIG. 1(A). A photosensor array 110 disposed on substrate 105 typically comprises a plurality of electronic components, such as address lines, photodiodes and switching devices, e.g., thin film transistors (TFTs).

Figure 1B:
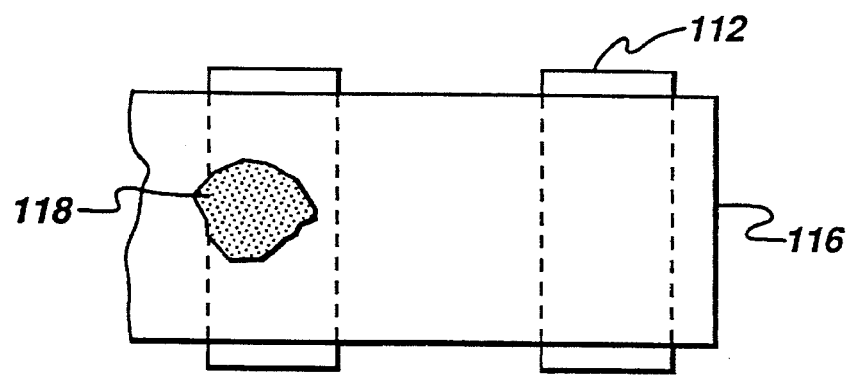

For purposes of illustration but not limitation, a first non-insulative layer 112 of electronic components in photosensor array 110 is shown in FIG. 1 (A) disposed on substrate 105. As used herein, "non-insulative" refers to a component layer that comprises conductive or semiconductive material; typically, however, a short circuit to be repaired as described herein is between two conductive layers. Thus, for example, first non-insulative layer 112 comprises address lines 113a, 113b (only two of which am illustrated for representative purposes), or the like, comprising a conductive material, such as molybdenum, aluminum, or the like. A dielectric layer 114 is disposed over first non-insulative layer 112. Dielectric layer 114 comprises an organic dielectric material, such as polyimide or the like, or alternatively an inorganic dielectric material, such as silicon nitride or silicon oxide, or alternatively a combination of organic and inorganic dielectric materials. In a photosensor array as described herein, the dielectric material comprising layer 114 is substantially transparent to optical photons. A second non-insulative layer 116 is disposed over dielectric layer 114; second non-insulative layer 116 typically comprises a substantially transparent conductive oxide such as indium tin oxide (ITO) or the like and is the common electrode coupling photodiodes disposed in photosensor array 110.

A representative short circuit condition is illustrated in FIG. 1 (A); FIG. 1 (B) is a plan view illustration of the same representative short circuit condition. The short circuit condition results from, for example, a defect 118 in dielectric material 114 that comprises, for example, an impurity in the dielectric material, such as an electrically conductive material that became entrained with the dielectric material when it was deposited or that is an artifact from the deposition of other components in the array, such as from first non-insulative layer 112. As illustrated in FIG. 1 (A), defect 118 is disposed such that it is electrically coupled to common electrode 116 and address line 113a at situs 119a and 119b, respectively, such that a conductive path between first non-insulative layer 112 and second non-insulative layer 116 exists. Such a conductive path is undesired as it shorts the two conductive layers together, rendering the photodiodes electrically coupled to these two conductive layers inoperative. Indeed, all photodiodes in the array are typically coupled to the common electrode 116, and until such time as the short to the affected address line 113a is isolated, operation of the whole photosensor array is degraded unless address line 113a is electrically isolated. Cutting or otherwise electrically isolating the address line, however, results in the loss of all photodiode pixels driven off of that address line.

In accordance with this invention, wafer assembly 100 is repaired in a process comprising the step of ablating a portion of common electrode layer 116 to electrically isolate situs 119a of the short circuit in common electrode layer 116 without breaking the electrical integrity of address line 113a. As used herein, the term "ablate", "ablation", and the like refer to the process by which a beam of energy, such as a laser beam, is directed onto wafer assembly 100 to cause some portion of the material disposed thereon to be removed, typically by vaporization resulting from absorption of energy from the laser beam. The energy is absorbed in a relatively localized area and the vaporized material typically is rapidly expelled in a plume from the area in which it was located. The expulsion of material can also serve to remove materials located in layers in the path of the expelled vapor. "Electrical integrity" refers to the conductivity of first non-insulative layer 112, e.g., address line 113a, specifically that the address line retains electrical conductivity characteristics, such as line resistance and the like, that enable it to continue to function as designed in photosensor array 110.

A laser beam is used to ablate common electrode layer 116. In accordance with this invention, the laser is controlled to apply a selected energy density to the portion of common electrode layer 116 such that the integrity of underlying address line 113a is maintained, e.g., address line 113a is not damaged. Thus, the penetration of the laser beam through common electrode 116 and dielectric layer 114, and resulting ablation of the material in which the energy of the beam is absorbed, is controlled such that only a selected portion of the dielectric layer is ablated. The selected energy density is determined by selecting an ablating light frequency, a laser ablating pulse rate, and a laser ablating pulse width.

The ablating light frequency is selected such that the majority of energy in the laser beam is absorbed at a level in the wafer to ablate the desired material, and similarly such that the light energy of the laser does not penetrate so far into the wafer assembly so as to cause unwanted damage in material layers other than the portion of the wafer assembly to be ablated (such as first non-insulative layer 112). For example, in photosensor array 110 described above in which common electrode 116 comprises a layer of indium tin oxide (ITO) having a thickness in the range of about 500 Å to about 5000 Å (and the thickness commonly being about 700 Å), and dielectric layer 114 comprises polyimide having a thickness in the range between about 0.5 µm to 5 µm (and the thickness commonly being about 1.5 µm), it is advantageous that the laser beam comprise ultraviolet light (e.g., light having a wavelength between about 10 nm and 390 nm). A portion of the energy in the laser beam of ultraviolet light is absorbed in the ITO of common electrode layer 116, and substantially all of the remaining portion of the beam's energy is readily absorbed in the polyimide of dielectric layer 114. The absorption of the light by the ITO and the underlying polyimide results in the ablation of the illuminated surfaces, with the explosive dispersal of the polyimide helping to carry away the ITO disposed on that portion of the polyimide ablated.

The wavelength of the light generated by the laser is selected to be absorbed by the material which it is desired to ablate in wafer assembly 100. Ultraviolet light is generated by a frequency quadrupled Q-switched YAG laser; alternatively, other lasers adapted to generation of UV light can be used, such as an excimer laser or an argon laser. The particular laser beam wavelength selected is dependent on the nature of the material to be ablated; polyimide is readily ablated by beams having a wavelength of about 350 nm and below, whereas inorganic dielectric material, such as silicon oxide or silicon nitride are more readily ablated by shorter wavelengths. Further information pertaining to wavelength dependency of ablation characteristics appears in the article entitled "Laser ablation of polymers for high-density interconnect" by Y. S. Liu, H. S. Cole, and R. Guida, appearing in *Microeletronic Engineering*, 20: 15–29 (1993). which is incorporated herein by reference.

The energy delivered by a given laser beam to the ablated surface is determined by the laser pulse rate and the pulse width. Generally, shorter pulse widths imply that higher power is delivered to the material in which the energy is absorbed. Control of the laser pulse rate determines the number of laser pulses delivered per second and thus effects the rate of ablation of the material in which the laser beam is absorbed. A typical laser pulse rate in accordance with this invention is between about 1 and 10 pulses per second. Optics coupled to the laser (such as a focussing lens) are advantageously used to control the size and shape of the area illuminated by the beam on the surface of wafer assembly 100; such control of the area of beam on the material in which the light is absorbed also determines the pulse energy density (by determining the area in which the energy of the pulse is applied to the material). The energy density delivered to a particular surface in wafer assembly 100 is thus determined by selection of each of these parameters, and for the ITO/polyimide structure described above, the energy density per pulse is in the range of between about 1 and 10 joules/cm$^2$ and the laser energy per pulse is typically about 1 microjoule or less. The energy density is selected to ablate the desired material (e.g., the ITO comprising the common electrode) and penetrate only a selected distance into surrounding materials (e.g., the polyimide dielectric material underlying the ITO).

Figures 2A, 2B, 2C:
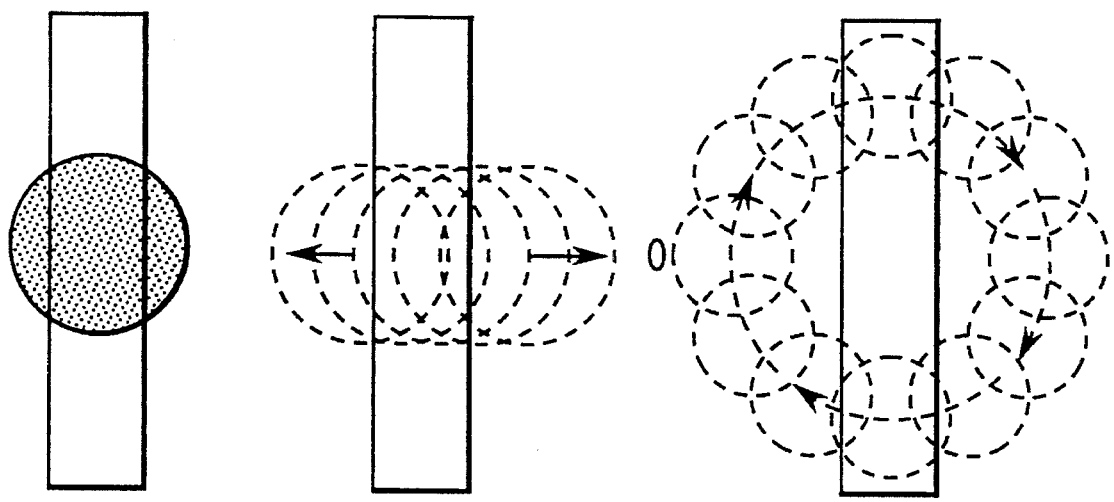
FIGS. 2(A)–2(C) illustrate three respective scan patterns of a laser beam used in accordance with this invention to isolate the situs of a short circuit in an upper conductive layer of an electronic array wafer.

The laser beam is directed onto portions of common electrode 116 in accordance with a selected pattern to ablate common electrode 116 so as to electrically isolate situs 119a of the short circuit. For example, a spot scan, as illustrated in FIG. 2(A) can be used to ablate the common electrode in an area corresponding to the size and shape of the laser beam incident on the surface of wafer assembly 100 (as determined, for example, by the laser optics). A line scan, as illustrated in FIG. 2(B) can alternatively be used; in the line scan, the pulsed laser beam is moved across the ITO layer along a substantially straight line or axis, creating a series of cuts corresponding to a linear cut in the common electrode. A circular scan, as illustrated in FIG. 2(C) can alternatively be used; in the circular scan the pulsed laser beam is directed so as to inscribe a substantially circular pattern in the ITO. The circular scan can be advantageously used to isolate the situs of the short circuit to the common electrode by moving the laser beam around the situs, thus electrically isolating the situs of the short circuit from the remainder of the common electrode. The circular scan is particularly useful in electrically isolating a portion of the common electrode in which a vertical defect short circuit exists without requiring precise alignment of the laser and the wafer assembly.

The process of the present invention was demonstrated in the ablation of a test array having an ITO layer (corresponding to common electrode 116) deposited on a spun-on polyimide layer having a thickness of 1.5 μm (corresponding to dielectric layer 114), and a molybdenum metal film underlying the polyimide (corresponding to address line 113), deposited on a glass substrate. A frequency quadrupled Q-switched YAG laser was used to generate a beam of ultraviolet light (having a wavelength of 266 nm). The ultraviolet light was generated from two doubling crystals, one KTP (Potassium Titanyl Phosphate) and one BBO (Barium Borate Oxide) used in tandem. Beam shaping optics comprising a focussing lens were used to focus the beam to a have a substantially circular shape with a diameter of about 10 μm where it was incident on the test array. The beam optics were also used to control the exposure energy density to about several joules per pulse (e.g., in the range of 1 to 10 joules/cm$^2$). The beam was applied to the test array in a variety of scanning patterns and then scanning electron microscope micrographs were prepared which showed that the ITO in the exposed area was ablated with little of the underlying polyimide being removed in the ablation process (about 0.2 μm of the polyimide is removed per pulse, thus the number of pulses delivered to a particular area can be used to determine the depth to which the polyimide is ablated). No damage was detected to the underlying address lines, and the electrical integrity of these lines was not affected by the ablation process of the ITO layer.

The method of the present invention thus allows repair of electronic arrays having short circuits resulting from vertical defects in dielectric layers that is effective, and is relatively quick and simple to accomplish.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of repairing an imager array having a vertical short circuit across an optically transmissive dielectric layer between an imbedded electrically conductive component and an optically transmissive common electrode layer overlying the imager array, comprising the steps of:

directing a laser beam onto said optically transmissive common electrode layer to ablate the portion of said optically transmissive common electrode layer exposed to said laser beam and so as to electrically isolate a situs of said short circuit in said optically transmissive common electrode layer, and controlling said laser beam so as to deliver an energy density to said optically transmissive common electrode layer such that the electrical integrity of said imbedded electrically conductive component underlying the situs of said shod circuit is not broken, the step of controlling said laser beam so as to deliver an energy density to said optically transmissive common electrode layer comprising the steps of selecting an ablating light frequency that is in the range of ultraviolet light, a laser ablating pulse rate, and a laser ablating pulse width whereby sufficient energy is absorbed by said optically transmissive common electrode layer and at least portions of the underlying optically transmissive dielectric layer to effect the electrical isolation of the shod circuit situs without being transmitted through the underlying optically transmissive dielectric layer to damage the electrical integrity of underlying conductive components in the array.

2. The method of claim 1 wherein the step of controlling said laser beam further comprises the step of directing said beam through optical components to control the size and shape of said beam.

3. The method of claim 2 wherein the step of directing said laser beam onto said optically transmissive common electrode layer to electrically isolate the situs of said short circuit comprises scanning said laser beam over said transparent conducting oxide in a pattern selected from the group consisting of spot scans, line scans, and circular scans.

4. The method of claim 1 wherein said optically transmissive common electrode layer comprises indium tin oxide and said dielectric layer comprises polyimide.

5. The method of claim 4 wherein said energy density is in the range between about 1 joule/cm$^2$ to 10 joule/cm$^2$.

6. The method of claim 5 wherein said laser ablating pulse width is less than about 100 nanoseconds.

7. The method of claim 6 wherein said laser ablating pulse rate is in the range between about 1 to 10 pulses per second.

8. The method of claim 1 wherein the step of directing a laser beam onto said optically transmissive common electrode layer further comprises ablating a portion of said optically transmissive dielectric layer underlying said optically transmissive common electrode layer to a penetration depth not greater than the thickness of said optically transmissive dielectric layer underlying said common electrode layer at the point said laser beam is applied.

* * * * *

UNITED STATES PATENT AND TRADEMARK OFFICE
CERTIFICATE OF CORRECTION

Page 1 of 1

PATENT NO.       : 5,518,956
APPLICATION NO.  : 08/115082
DATED            : May 21, 1996
INVENTOR(S)      : Liu et al.

It is certified that error appears in the above-identified patent and that said Letters Patent is hereby corrected as shown below:

Col. 6, line 50 (Claim 1), delete "shod" and
substitute therefore -- short --.

Signed and Sealed this
Fourteenth Day of June, 2011

David J. Kappos
*Director of the United States Patent and Trademark Office*